US008510611B2

(12) United States Patent
Hishinuma et al.

(10) Patent No.: US 8,510,611 B2
(45) Date of Patent: Aug. 13, 2013

(54) COMPUTER APPARATUS

(75) Inventors: Takeo Hishinuma, Kawasaki (JP);
Yoshinori Mesaki, Kawasaki (JP);
Osamu Ishibashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 421 days.

(21) Appl. No.: 12/510,426

(22) Filed: Jul. 28, 2009

(65) Prior Publication Data

US 2010/0088558 A1 Apr. 8, 2010

(30) Foreign Application Priority Data

Oct. 3, 2008 (JP) ................................. 2008-258974

(51) Int. Cl.
*G11C 29/00* (2006.01)
*G06F 11/00* (2006.01)

(52) U.S. Cl.
USPC ................................. 714/718; 714/25; 714/48

(58) Field of Classification Search
USPC ................... 714/718, 25, 6.1, 6.12, 6.13, 38, 714/710, 725, 723, 31, 42, 53, 36, 48; 365/200, 365/201, 230.33
See application file for complete search history.

(56) References Cited

U.S. PATENT DOCUMENTS

| 4,873,705 | A | | 10/1989 | Johnson |
| 4,953,165 | A | * | 8/1990 | Jackson ........................... 714/44 |
| 5,539,878 | A | | 7/1996 | Kikinis |
| 5,768,495 | A | * | 6/1998 | Campbell et al. ................. 714/25 |
| 6,076,142 | A | * | 6/2000 | Corrington et al. ............ 711/114 |
| 6,185,696 | B1 | * | 2/2001 | Noll ................................ 714/6.1 |
| 6,829,722 | B2 | | 12/2004 | Lin |
| 7,328,380 | B2 | * | 2/2008 | Pomaranski et al. ............ 714/718 |
| 7,478,281 | B2 | * | 1/2009 | Denniston ......................... 714/31 |
| 8,176,365 | B2 | * | 5/2012 | Hishinuma et al. .............. 714/31 |
| 2004/0170070 | A1 | * | 9/2004 | Rapp et al. ....................... 365/200 |
| 2004/0215952 | A1 | | 10/2004 | Oguma |
| 2007/0011522 | A1 | | 1/2007 | Denniston |
| 2007/0245170 | A1 | * | 10/2007 | Crowell et al. .................. 714/36 |
| 2010/0125752 | A1 | * | 5/2010 | Chen et al. ......................... 714/6 |
| 2010/0281297 | A1 | * | 11/2010 | Jibbe et al. ......................... 714/6 |

FOREIGN PATENT DOCUMENTS

| EP | 0442651 A2 | 8/1991 |
| JP | 2-242439 A | 9/1990 |
| JP | 06-004413 A | 1/1994 |
| JP | 7-191856 A | 7/1995 |
| JP | 2005-182263 A | 7/2005 |
| TW | 463175 B | 11/2001 |

OTHER PUBLICATIONS

European Search Report dated Jan. 27, 2010, issued in corresponding European Patent Application No. 09166742.8.
Japanese Office Action dated Feb. 19, 2013, issued in corresponding Japanese Patent Application No. 2008-258974, w/ English translation.
Taiwanese Office Action dated Apr. 2, 2013, issued in corresponding Taiwanese Patent Application No. 098125685, w/ English translation.

* cited by examiner

*Primary Examiner* — Phung M Chung
(74) *Attorney, Agent, or Firm* — Westerman, Hattori, Daniels & Adrian, LLP

(57) ABSTRACT

A computer apparatus includes a main memory, a first memory diagnosis unit that determines a faulty area in the main memory by executing a first memory diagnostic program, and a storage unit that stores a relocatable second memory diagnostic program. Moreover, the computer apparatus includes a second memory diagnosis unit, that loads the second memory diagnostic program into areas of the main memory other than the faulty area determined by the first memory diagnosis unit.

18 Claims, 6 Drawing Sheets

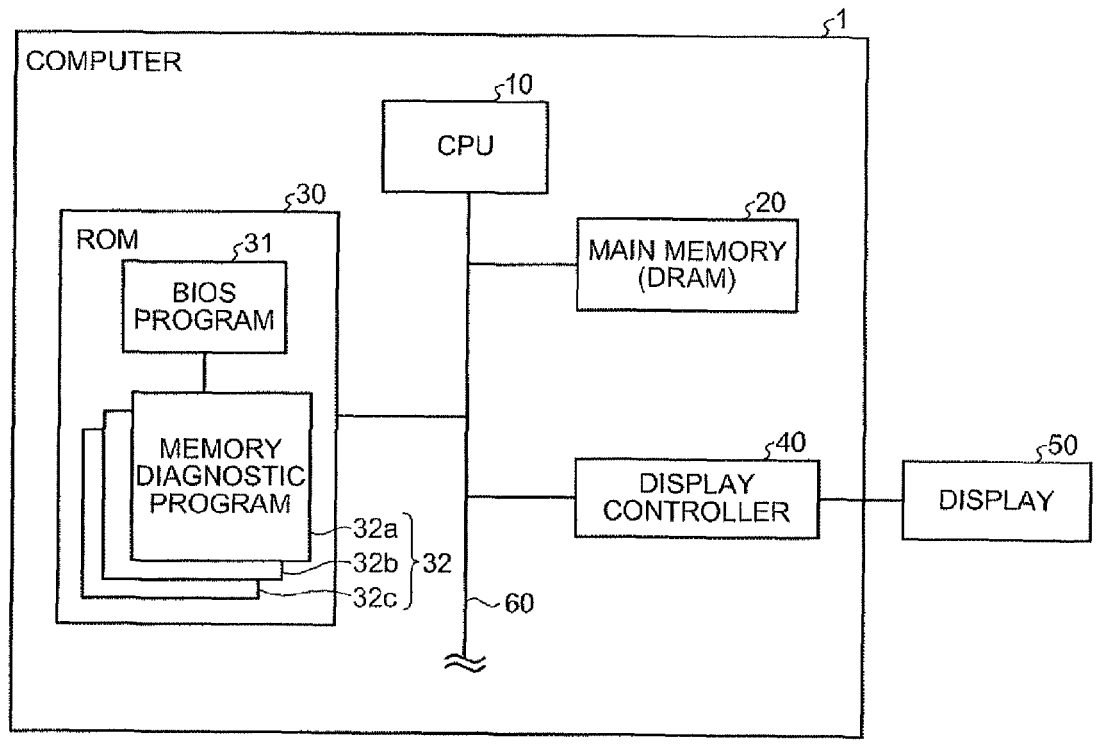

FIG.4A

| MEMORY ADDRESS | DIAGNOSIS RESULT |
|---|---|
| 1 | 1 |
| 2 | 1 |
| 3 | 0 |
| 4 | 1 |
| 5 | 1 |
| 6 | 1 |
| 7 | 1 |
| 8 | 1 |
| 9 | 1 |
| 10 | 1 |
| 11 | 1 |
| 12 | 1 |
| 13 | 1 |
| 14 | 1 |
| 15 | 1 |
| 16 | 1 |
| 17 | 1 |
| 18 | 1 |
| 19 | 0 |
| 20 | 1 |

FIG.4B

| | | | 20 |
|---|---|---|---|
| 1 (1) | 1 (2) | 0 (3) ✕ | 1 (4) |
| 1 (5) | 1 (6) | 1 (7) | 1 (8) |
| 1 (9) | 1 (10) | 1 (11) | 1 (12) |
| 1 (13) | 1 (14) | 1 (15) | 1 (16) |
| 1 (17) | 1 (18) | 0 (19) ✕ | 1 (20) |

FIG.4C

| MEMORY ADDRESS | DIAGNOSIS RESULT |
|---:|---:|
| 1 | 2 |
| 2 | 2 |
| 3 | 0 |
| 4 | 2 |
| 5 | 1 |
| 6 | 2 |
| 7 | 2 |
| 8 | 2 |
| 9 | 2 |
| 10 | 2 |
| 11 | 2 |
| 12 | 2 |
| 13 | 2 |
| 14 | 2 |
| 15 | 2 |
| 16 | 2 |
| 17 | 2 |
| 18 | 2 |
| 19 | 0 |
| 20 | 1 |

| MEMORY ADDRESS | DIAGNOSIS RESULT |
|---|---|
| 1 | 3 |
| 2 | 3 |
| 3 | 0 |
| 4 | 2 |
| 5 | 1 |
| 6 | 3 |
| 7 | 3 |
| 8 | 3 |
| 9 | 3 |
| 10 | 3 |
| 11 | 3 |
| 12 | 3 |
| 13 | 3 |
| 14 | 3 |
| 15 | 3 |
| 16 | 3 |
| 17 | 3 |
| 18 | 3 |
| 19 | 0 |
| 20 | 1 |

FIG.4F

COMPUTER APPARATUS

CROSS-REFERENCE TO RELATED APPLICATION

This application is based upon and claims the benefit of priority of the prior Japanese Patent Application No. 2008-258974, filed on Oct. 3, 2008, the entire contents of which are incorporated herein by reference.

FIELD

The embodiment discussed herein is directed to a computer apparatus, and a method of diagnosing memories.

BACKGROUND

Computer apparatuses use many kinds of diagnostic tests that diagnose defective portions of each built-in device. As an example of the computer apparatus, a diagnostic tool is disclosed that runs a memory diagnostic test to diagnose if a memory function in a built-in memory properly works, e.g., if predetermined data can be normally read from and written into the memory. See, for example, Japanese Laid-open Patent Publication No. H6-4413.

In the simplest diagnostic test, a memory diagnostic program is stored beforehand in one portion of a basic input/output system (BIOS) of the computer apparatus. When the computer apparatus starts up, the memory diagnostic program operates together with the BIOS.

However, the BIOS usually has a very limited storage capacity, in which another program such as an initial program loader (IPL) is stored. Therefore, the BIOS can contain only a simple memory diagnostic program. Thus, in conventional computer apparatuses, a memory diagnostic program for performing complicated memory checking is generally loaded into a main memory such as a random access memory (RAM) by an operating system (OS) and is executed, after the BIOS has operated and the OS has started up.

Incidentally, conventional computers properly function, only if no fault is found in all addresses in the main memory. However, currently, even when some faulty areas are discovered in the main memory by checking the main memory beforehand, a new type of computer apparatus is expected that can run properly by not using the faulty areas.

To properly run the computer apparatus in spite of the presence of faulty areas in the main memory, the faulty areas need to be detected before the OS starts up.

However, the memory diagnostic program stored in the BIOS cannot perform a memory diagnosis that allows the OS to properly function.

The following technique can be considered in this situation. The complicated memory diagnostic program, which was conventionally processed by the OS, is stored in a memory such as a read-only memory (ROM) other than the BIOS. At the same time, a loading program, which loads the complicated memory diagnostic program in predetermined addresses of the main memory, is stored in the BIOS. This enables the complicated memory diagnostic program to be started up when the computer apparatus boots up.

However, this structure leads to the situation where the memory diagnostic program is loaded into the main memory prior to the memory diagnosis. That is, the memory diagnostic program is loaded into the main memory, while it is unknown whether or not the areas of the main memory, into which the memory diagnostic program is loaded, are faulty. Therefore, there is a possibility that the memory diagnostic program itself cannot be executed.

SUMMARY

According to an aspect of the invention, a computer apparatus having a main memory includes a first memory diagnosis unit for determining a faulty area in the main memory by executing a first memory diagnostic program; a storage unit for storing a relocatable second memory diagnostic program; and a second memory diagnosis unit for loading the second memory diagnostic program into areas of the main memory other than the faulty area determined by the first memory diagnosis unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is a block diagram illustrating a structure of a computer device in accordance with an embodiment of the invention;

FIG. 2 illustrates the details of a dynamic random access memory (DRAM) of FIG. 1;

FIG. 4A is a memory-quality evaluation table after a memory diagnostic program 32a has been executed;

FIG. 4B illustrates an allocated area on the DRAM when a memory diagnostic program 32b is loaded therein;

FIG. 4C is a memory-quality evaluation table after a memory diagnostic program 32b has been executed;

FIG. 4D illustrates an allocated area on the DRAM when a memory diagnostic program 32c is loaded therein;

FIG. 4E is a memory-quality evaluation table after a memory diagnostic program 32c has been executed;

FIG. 4F illustrates the result derived by diagnosing the DRAM; and

DESCRIPTION OF EMBODIMENT

Figure 3:
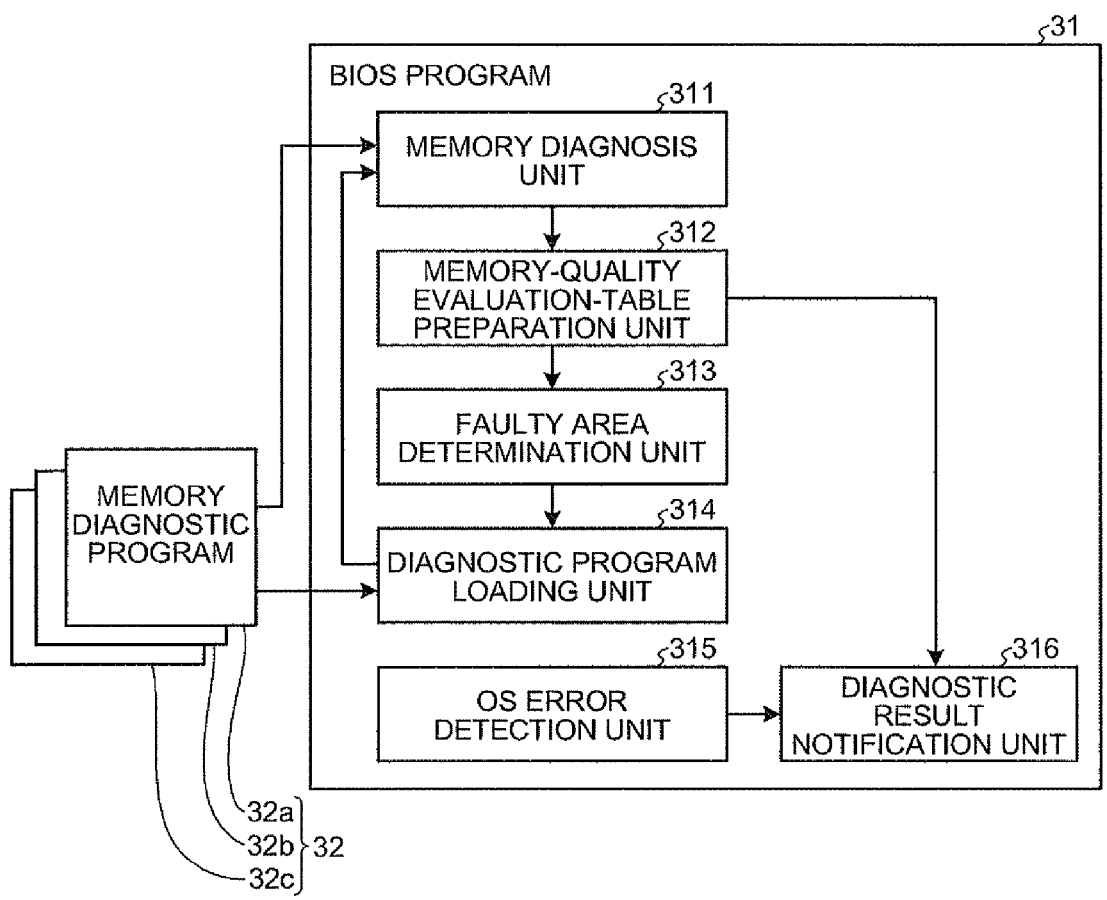
FIG. 3 is a functional block diagram illustrating the details of a BIOS program of FIG. 1.

Preferred embodiments of the present invention will be explained with reference to the accompanying drawings.

The features of a computer apparatus in accordance with the embodiment are described below. The computer apparatus includes a main memory, a first memory diagnostic unit that identifies a faulty or defective area of the main memory by executing a first memory diagnostic program, a storage unit that stores a second memory diagnostic program, which is relocatable, and a second memory diagnostic unit that loads and executes the second memory diagnostic program stored in the storage unit into the area (called the "non-faulty" or "non-defective" area) except the defective areas identified by the first memory diagnosis unit, of the main memory That is, the computer apparatus in accordance with the embodiment diagnoses the main memory such as a dynamic random access memory (DRAM) therein, by executing a plurality of memory diagnostic programs.

Specifically, the storage unit, such as a read only memory (ROM) in the computer apparatus, stores beforehand a plurality of different memory diagnostic programs. The first memory diagnostic unit diagnoses the main memory, by running the first memory diagnostic program of the plurality of the memory diagnostic programs.

The plurality of the memory diagnostic programs each diagnoses different memory functions and includes a different program size according to the diagnostic level of the memory function. That is, the memory diagnostic program has a larger program size for diagnosis of more advanced memory functions. The first memory diagnostic program belongs to the lowest diagnostic level in the memory function and has the smallest program size.

The first memory diagnostic unit in accordance with the embodiment executes the first memory diagnostic program, without loading the first memory diagnostic program into the main memory. Thus, a simple diagnosis of the memory function is performed first by the first memory diagnostic unit without using the main memory. Then, a more advanced diagnosis of the memory function is performed by the second memory diagnostic unit. Therefore, at a stage where it is not clear whether or not there is a defective area in the main memory, a memory diagnostic program does not have to be loaded into the main memory. This avoids a situation where the memory diagnostic programs become unexecutable.

If the first memory diagnostic program is loaded into the main memory to occupy relatively small areas thereon, it may be that the first memory diagnostic unit loads the first memory diagnostic program into the main memory.

The second memory diagnosis unit loads the second memory diagnostic program stored in the storage unit such as a ROM into areas other than the defective areas in the main memory identified by the first memory diagnosis unit, and executes the second memory diagnostic program. That is, the second memory diagnosis unit excludes defective areas identified by the first memory diagnosis unit from the areas in the main memory for loading the second memory diagnostic program. The defective area is defined as an area, in all the areas of a main memory, where memory functions such as read and write functions do not work properly. The second memory diagnostic program performs a higher level of diagnosis of memory functions, and is larger in size, than the first memory diagnostic program By doing so, the computer apparatus in accordance with the embodiment can avert a situation where the second diagnostic program is loaded by mistake in the defective areas, which cannot properly execute the second diagnostic program.

The second memory diagnosis unit then diagnoses the main memory again, by executing the second memory diagnosis program that has been loaded into part of the area that is not the defective areas. Next, the second memory diagnosis unit identifies a new defective area from the areas other than the defective areas identified previously, based on the results of the main memory diagnosed by the second memory diagnostic program. Further, the second memory diagnosis unit excludes as the defective areas the newly and previously discovered defective areas from the areas into which the next memory diagnostic programs (i.e., the third memory diagnostic program and programs thereafter) are to be loaded. These processes are repeated until all of the memory diagnostic programs stored in the storage unit such as a ROM have finished running. Thus, memory diagnostic programs after the second memory diagnostic program are always loaded into non-faulty areas of the main memory. Thus, the memory diagnostic programs can be properly executed.

In this way, according to the embodiment, first, the first memory diagnostic program that does not use the main memory or occupies only a small part of the main memory is executed for a simple diagnosis of the main memory. Then, making use of the diagnosis results, an arrangement location for the second memory diagnostic program, which needs to be loaded into the main memory and can provide a detailed diagnosis of the memory, is identified. Therefore, this reduces the possibility that the memory diagnostic programs after the second memory diagnostic program are loaded into the defective areas in the main memory where the memory functions do not properly work and averts a situation where the memory diagnostic programs after the second memory diagnostic program become unexecutable.

The structure of a computer apparatus in accordance with the embodiment of the invention is explained with reference to FIG. 1. FIG. 1 is a block diagram illustrating the structure of a computer apparatus 1 in accordance with the embodiment. FIG. 2 illustrates the details of a DRAM illustrated in FIG. 1.

As illustrated in FIG. 1, the computer apparatus 1 includes a central processing unit (CPU) 10, a DRAM 20, a ROM 30, a display controller 40, and a bus 60 that connects the elements described above.

The CPU 10 controls the overall operation of the computer apparatus 1. Specifically, when the computer apparatus 1 starts up, the CPU 10 reads a basic input output system (BIOS) program 31 (which will be described later) from the ROM 30 and executes the BIOS program 31 to check if there is an error in the devices such as DRAM 20. The CPU 10 also executes startup of an operating system (OS) and control of various devices by executing the BIOS program 31.

The DRAM 20 is a main memory (a main storage unit) for the computer apparatus 1. Specifically, the DRAM 20 is a device in which the programs (including the BIOS program 31) to be executed by the CPU 10 are loaded, and is used as a working memory to temporarily store various data related to the programs. Furthermore, the DRAM 20, as illustrated in FIG. 2, is divided into a plurality of areas (1) to (20) in order to load a program to be executed by the CPU 10.

The ROM 30, functioning as a storage unit, stores data and various programs the CPU 10 executes. The programs the ROM 30 stores include the BIOS program 31 and a plurality of memory diagnostic programs 32.

The BIOS program 31 is a basic input and output program. Specifically, the BIOS program 31, which starts running when the computer apparatus 1 is turned on, is a control program that controls input and output data between the OS and application programs and the DRAM 20 and peripheral devices (display, keyboard, etc.). Moreover, the BIOS program 31 conducts a memory diagnostic process to confirm that data is properly read from and written to the DRAM 20 and that the functions related to a memory protection function and error correction functions properly work. A specific structure by which the BIOS program 31 performs a memory diagnosis process is described below in detail.

The plurality of memory diagnostic programs 32 is executed when the BIOS program 31 conducts a memory diagnosis process of the DRAM 20 and is a collection of programs to check if various memory functions of the DRAM 20 properly work (e.g., if predetermined data can properly be written in and read from the memory). In this embodiment, the memory diagnostic programs 32 include three memory diagnostic programs 32a, 32b, and 32c. Each of the memory diagnostic programs 32a, 32b, and 32c is designed for diagnosing a distinct memory function and has a different program size depending on the diagnostic level of the memory functions. For example, in the embodiment, 32a has the lowest diagnostic level of the memory functions, followed by 32b and then 32c in that order, and the program sizes thereof also increase in the same order. The memory diagnostic program 32a has the lowest diagnostic level of the memory functions and is the smallest in program size of the three memory diagnostic programs.

The display controller 40 is connected to a display 50 and supplies an output such as the result of memory diagnosis of the DRAM 20. The display 50 is an image display device that visibly shows the output from the display controller 40.

With reference to FIG. 3, a specific structure that allows the BIOS program 31 to perform a memory diagnostic process on the DRAM 20 is described in detail. FIG. 3 is a block diagram illustrating the details of the BIOS program 31 of FIG. 1 and illustrates the functions that can be performed when the BIOS program 31, which is stored in the ROM 30, is executed by the CPU 10.

The BIOS program 31 includes a memory diagnostic unit 311, a memory-quality evaluation-table preparation unit 312, a faulty area determination unit 313, a diagnostic program loading unit 314, an OS error detection unit 315, and a diagnostic result notification unit 316. These functional units 311-316 are executed when the BIOS program 31 starts up (is executed).

The BIOS program 31, as described above, is executed first when the computer apparatus 1 starts up. Thus, the memory diagnostic process of the DRAM 20 is executed before the OS boots up, which enables a memory diagnostic program to run normally even if the OS does not start up.

The memory diagnosis unit 311 starts diagnosing the DRAM 20 by running the memory diagnostic program 32a, which is the first memory diagnostic program of the memory diagnostic programs 32. Furthermore, the memory diagnosis unit 311 runs the memory diagnostic program 32a without loading the memory diagnostic program 32a into the DRAM 20. As described above, the memory diagnostic program 32a contains the lowest diagnostic level for the memory functions and has the smallest program size of the memory diagnostic programs 32. The program size of the memory diagnostic program 32a is set to be small, which eliminates the need to load the memory diagnostic program 32a into the DRAM 20. This can avoid loading the memory diagnostic program into the DRAM 20 when it is unclear that the DRAM 20 has a defective area.

The memory-quality evaluation-table preparation unit 312 produces a memory-quality evaluation table that associates the diagnostic results from the memory diagnosis unit 311 with the address information on the DRAM 20. The memory-quality evaluation table will be described below in detail when the procedure of the memory diagnostic process is explained.

The faulty area determination unit 313 determines faulty or defective areas in the DRAM 20, based on the diagnostic results from the memory diagnosis unit 311. Specifically, the faulty area determination unit 313 extracts the address information on the DRAM 20 that is diagnosed as being in error by the memory diagnosis unit 311, referring to the memory-quality evaluation table produced by the memory-quality evaluation-table preparation unit 312, to determine a faulty area in the DRAM 20 based on the extracted address information. In this case, the memory diagnosis unit 311 and the faulty area determination unit 313 function as a first memory diagnosis unit for determining a faulty area in the DRAM 20, the main memory, by executing the first memory diagnostic program 32a.

The diagnostic program loading unit 314 loads the memory diagnostic program 32b, which is the second memory diagnostic program stored in the ROM 30, into the areas other than the faulty areas, which are determined by the faulty area determination unit 313 for all the areas (1) to (20) of the DRAM 20. To be specific, the diagnostic program loading unit 314 extracts the address information of the DRAM 20 that is diagnosed as being in error by the memory diagnosis unit 311, referring to the memory-quality evaluation table prepared by the memory-quality evaluation-table preparation unit 312. Then, the diagnostic program loading unit 314 excludes the areas corresponding to the extracted address information as faulty areas, from the areas for loading the memory diagnosis program 32b. In other words, the diagnostic program loading unit 314 sets a part of the areas except the faulty areas as areas for loading the second memory diagnostic program 32b.

Then, the memory diagnosis unit 311 newly diagnoses areas other than the faulty areas determined by the faulty area determination unit 313, of all the areas (1) to (20) of the DRAM 20, by executing a memory diagnostic program 32b that is loaded by the diagnosis program loading unit 314. In this case, the diagnostic program loading unit 314 and the memory diagnosis unit 311 function as the second memory diagnosis unit, which loads the second memory diagnostic program 32b into the areas other than the faulty areas determined by the faulty area determination unit 313 and executes the second memory diagnostic program 32b.

Next, based on the result of the new diagnosis by the memory diagnosis unit 311, the faulty area determination unit 313 determines new faulty areas, excluding the faulty areas previously determined by the faulty area determination unit 313, for all the areas (1) to (20) of the DRAM 20. The diagnostic program loading unit 314 excludes the faulty areas determined both previously and newly by the faulty area determining unit 313, as the faulty areas, from areas for loading the memory diagnostic program 32c that is to be executed next by the memory diagnosis unit 311.

The processes by the functional units 311-314 are repeatedly executed until all of the memory diagnostic programs 32 (32a-32c) are executed by the memory diagnosis unit 311. Because of this, the memory diagnostic program 32 is always loaded into non-faulty areas other than the faulty areas of the DRAM 20. Thus, the memory diagnostic program can be properly executed.

The OS error detection unit 315 detects an error when the OS starts up. Such an OS startup error includes a state in which the computer apparatus 1 stops working and does not receive inputs from a keyboard and mouse (known as hung-up), and a state in which the OS itself cannot process continuously (known as blue screen and black screen). When a startup time for the computer apparatus 1 in normal operation is measured beforehand, a timeout duration is determined to be stored in a predetermined area of the ROM 30, and the hung-up, blue screen, or black screen can be found even after the elapse of the timeout duration, the OS error detection unit 315 is designed to detect an OS startup error.

When the OS error detection unit 315 has detected an OS startup error, the diagnostic result notification unit 316 visually outputs to the display controller 40 the result of the memory diagnosis of the DRAM 20 by the memory diagnosis unit 311. The diagnostic result notification unit 316 functions as a means for notifying the results of the memory diagnosis of the DRAM 20 by the memory diagnosis unit 311. The test result notification unit 316 is also configured to output a memory-quality evaluation table prepared by the memory-quality evaluation-table preparation unit 312, as a result of memory diagnosis conducted on the DRAM 20 by the memory diagnosis unit 311.

With reference to FIGS. 4A to 4F, the procedure as to how the BIOS program 31 performs a memory diagnostic process of the DRAM 20 is specifically described. FIGS. 4A to 4F illustrate the procedure in which the BIOS program 31 executes the memory diagnostic process on the DRAM 20. FIGS. 4A and 4C illustrate a memory-quality evaluation table prepared by the memory-quality evaluation-table preparation unit 312 after the memory diagnostic programs 32a and 32b are executed, respectively. FIGS. 4B and 4D illustrate the areas of the DRAM 20, into which the next memory diagnostic programs 32b and 32c set by the diagnostic program loading unit 314 are to be loaded, respectively. Moreover, FIG. 4E illustrates a memory-quality evaluation table prepared by the memory-quality evaluation-table preparation unit 312 after the memory diagnostic program 32c is executed, while FIG. 4F illustrates a final result of the memory diagnosis on the DRAM 20.

As depicted in FIG. 4A, when the memory diagnostic program 32a is executed by the memory diagnosis unit 311, a memory-quality evaluation table that associates the results of diagnosis by the memory diagnosis unit 311 with the address information of the DRAM 20 is produced by the memory-quality evaluation-table preparation unit 312. In this case, the memory diagnostic program 32a is executed by the memory diagnosis unit 311 without being loaded into the DRAM 20. In the memory-quality evaluation table produced by the memory-quality evaluation-table preparation unit 312, numeric value "1" as a result of the memory diagnosis of the DRAM 20 is assigned to the addresses of the DRAM 20 diagnosed as non-faulty by the memory diagnosis unit 311, while numeric value "0" as a result of the memory diagnosis of the DRAM 20 is allocated to the addresses of the DRAM 20 diagnosed as being in error by the memory diagnosis unit 311. In FIG. 4B, the areas (3) and (19), which are assigned "0", are diagnosed as being in error.

Next, as illustrated in FIG. 4B, the faulty areas in the DRAM 20 are determined by the faulty area determination unit 313, with reference to the memory-quality evaluation table represented in FIG. 4A. In FIG. 4A, out of all the areas (1) to (20) of the DRAM 20, the areas (3) and (19) that are diagnosed as being in error are determined to be faulty.

As illustrated in FIG. 48, part of the areas out of all the areas of the DRAM 20, excluding the faulty areas determined by the faulty area determination unit 313, are selected by the diagnostic program loading unit 314, as areas for loading the memory diagnostic program 32b that the memory diagnosis unit 311 is to execute next. In FIGS. 4A and 4B, out of all the areas (1) to (20) of the DRAM 20, part of the areas other than the faulty areas (3) and (19) are selected as areas for loading the memory diagnostic program 32b that is to be executed next.

Next, when the memory diagnostic program 32b is executed by the memory diagnosis unit 311, areas other than the faulty areas (3) and (19) out of all of the DRAM 20 areas (1) to (20) are newly diagnosed.

As illustrated in FIG. 4C, the memory-quality evaluation table is updated by the memory-quality evaluation-table preparation unit 312 using the new results of the diagnosis carried out by the memory diagnosis unit 311. That is, in the memory-quality evaluation table, out of all the areas of the DRAM 20, the numeric value "2" as a result of the memory diagnosis is newly assigned to the addresses of the areas that the memory diagnosis unit 311 has newly diagnosed as normal. In contrast, the numeric value "1" as a result of the memory diagnosis is maintained regarding the addresses of areas that the memory diagnosis unit 311 has diagnosed as being in error. In FIGS. 4C and 4D, the areas (5) and (20) to which the numeric value "1" as the memory diagnostic results are assigned, respectively, are newly diagnosed as being in error.

As depicted in FIG. 4D, new faulty areas out of all the areas (1) to (20) of the DRAM 20, excluding the old faulty areas (3) and (19), are determined by the faulty area determination unit 313, with reference to the memory-quality evaluation table in FIG. 4C. In FIGS. 4C and 4D, the areas (5) and (20) that are newly diagnosed as being in error, out of all the areas (1) to (20) of the DRAM 20, excluding the old faulty areas (3) and (19), are newly determined to be faulty areas.

As illustrated in FIG. 4D, part of the areas out of all the areas of the DRAM 20, excluding the faulty areas determined by the faulty area determination unit 313, are newly selected by the diagnostic program loading unit 314, as areas for loading the memory diagnostic program 32c that the memory diagnosis unit 311 is to execute next. In FIGS. 4C and 4D, out of all the areas (1) to (20) of the DRAM 20, part of the areas other than the faulty areas (3), (5), (19) and (20) are newly selected as areas for loading the memory diagnostic program 32c.

When the memory diagnostic program 32c is executed by the memory diagnosis unit 311, areas other than the faulty areas (3), (5), (19) and (20) out of all of the DRAM 20 areas (1) to (20) are newly diagnosed.

As illustrated in FIG. 4E, the memory-quality evaluation table is updated by the memory-quality evaluation-table preparation unit 312, using the new results of the diagnosis carried out by the memory diagnosis unit 311. That is, in the memory-quality evaluation table, out of all the areas of the DRAM 20, the numeric value "3" as a result of the memory diagnosis is newly assigned to the addresses of the areas that the memory diagnosis unit 311 has newly diagnosed as normal. In contrast, the numeric value "2" as a result of the memory diagnosis is maintained regarding the addresses of areas that the memory diagnosis unit 311 has diagnosed as being in error. In FIGS. 4E and 4F, the area (4) to which the numeric value "2" as the memory diagnostic results is assigned are newly diagnosed as being in error.

By executing the processes described above, as illustrated in FIG. 4F, a final result for the memory diagnosis is obtained that is accordance with the memory diagnosis process executed by the BIOS program 31.

Figure 5:
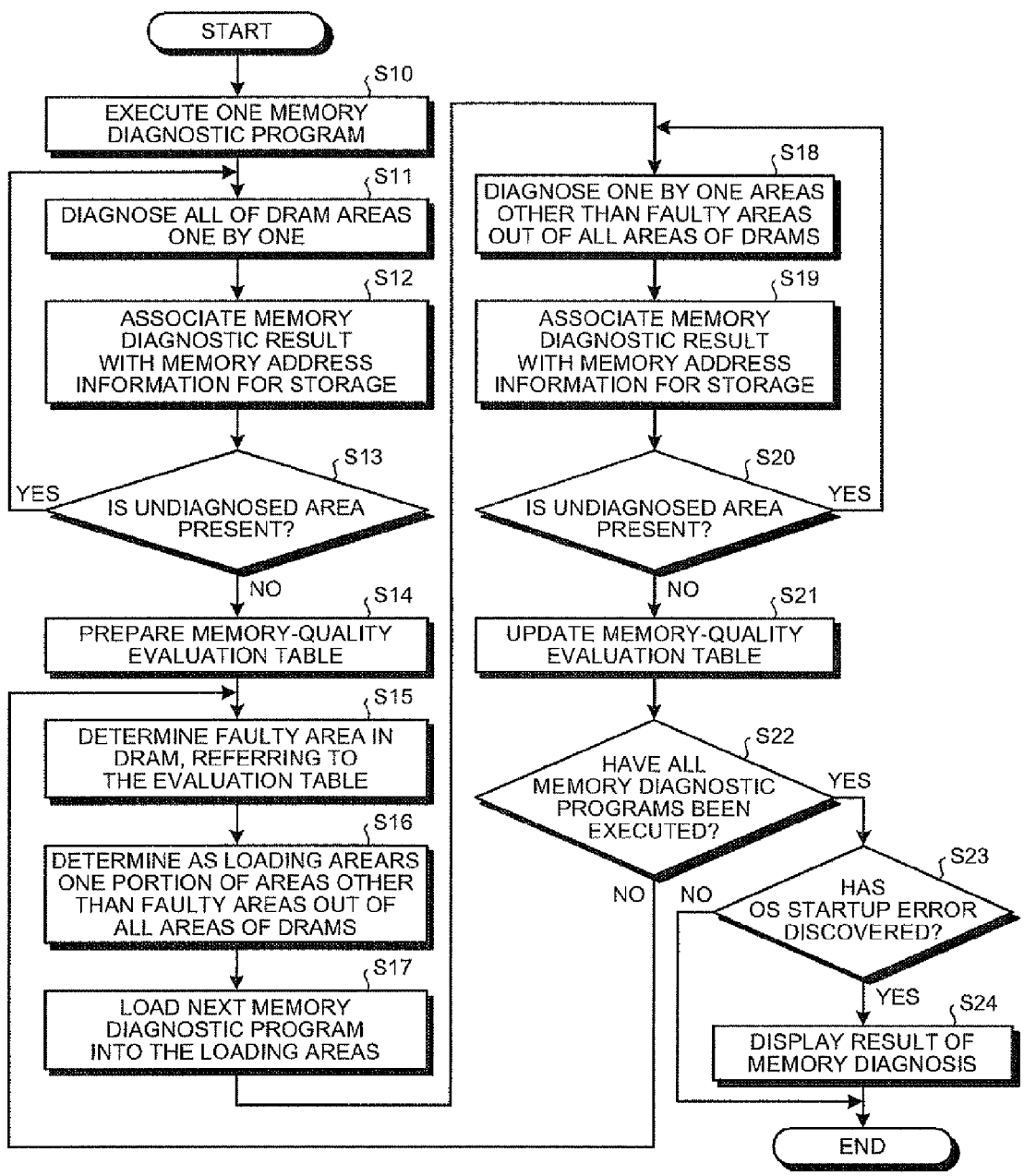
FIG. 5 is a flowchart illustrating the procedure of a memory diagnosis process by the computer device in accordance with the embodiment of the invention.

The memory diagnosis process of the computer apparatus 1 in FIG. 1 is described, with reference to FIG. 5. FIG. 5 is a flowchart illustrating the memory diagnosis process of the computer apparatus 1 in FIG. 1. The memory diagnosis process of FIG. 5 is a process executed by running the BIOS program 31 the CPU 10 has read out from the ROM 30 after the computer apparatus 1 is turned on.

As illustrated in FIG. 5, the memory diagnosis unit 311 of the BIOS program 31 executes the memory diagnostic program 32a of the memory diagnostic programs 32 (step S10) and diagnoses all the areas of the DRAM 20 one by one (step S11). The memory diagnosis unit 311 runs the memory diagnostic program 32a without loading the memory diagnostic program 32a into the DRAM 20. Then, the memory diagnosis unit 311 stores into each area of the DRAM 20 the result of the memory diagnosis and the address information of the DRAM 20, both of which are associated with each other (step S12).

Next, the memory diagnosis unit 311 determines if there is an undiagnosed area present in all the areas of the DRAM 20 (step S13). This determination is based on whether the memory diagnosis results have been associated with the address information of each area of the DRAM 20. If it is determined that an undiagnosed area is present somewhere in all the areas of the DRAM 20 (step S13; Yes), the memory diagnosis unit 311 repeats the processes of steps S11 to step S13 until there are no undiagnosed areas in all the areas of the DRAM 20.

If it is determined that there are no undiagnosed areas in all the areas of the DRAM 20 (step S13; No), the memory diagnosis unit 311 requests the memory-quality evaluation-table preparation unit 312 to make a memory-quality evaluation table. Upon receiving the request, the memory-quality evaluation-table preparation unit 312 prepares a memory-quality evaluation table in which the result of the memory diagnosis by the memory diagnosis unit 311 is associated with the address information of the DRAM 20 (step S14), and sends the prepared memory-quality evaluation table to the faulty area determination unit 313.

Then, referring to the received memory-quality evaluation table, the faulty area determination unit 313 extracts the address information on the DRAM 20 that is determined to be in error by the memory diagnosis unit 311 to determine a faulty area in the DRAM 20 according to the extracted address information (step S15).

The diagnostic program loading unit 314 determines as a loading area or areas one portion of the areas or part of the areas other than the faulty areas determined by the faulty area determination unit 313 at step S15, out of all the areas of the DRAM 20 (step S16), and loads the next memory diagnostic program 32b into the loading areas (step S17).

Next, the memory diagnosis unit 311, by executing the loaded memory diagnostic program 32b (step S18), diagnoses one by one all the areas of the DRAM 20 except the faulty areas. Then, the memory diagnosis unit 311 stores the result of the memory diagnosis and the address information on the DRAM 20 in each area of the DRAM 20, both of which are associated with each other (step S19).

Then, the memory diagnosis unit 311 determines if an undiagnosed area is present in the arrears other than the faulty areas of all the areas of the DRAM 20 (step S20). If the memory diagnosis unit 311 determines that an undiagnosed area is present (step S20; Yes), the memory diagnosis unit 311 repeats the processes steps S18 to S20 until an undiagnosed area cannot be discovered in the arrears other than the faulty areas of all the areas of the DRAM 20.

Conversely, if the memory diagnosis unit 311 determines that an undiagnosed area is absent in the areas other than the faulty areas of all the areas of the DRAM 20 (step S20; No), the memory diagnosis unit 311 requests the memory-quality evaluation-table preparation unit 312 to update the memory-quality evaluation table. Upon receiving the request, the memory-quality evaluation-table preparation unit 312 updates the memory-quality evaluation table (step S21).

After that, the memory diagnosis unit 311 determines if all the memory diagnostic programs 32a, 32b, and 32c have been executed (step S22). If the memory diagnosis unit 311 has determined that all the memory diagnostic programs have not been executed (step S22; No), the procedure returns to step S15. Then, the procedures of steps S15 to S22 are repeated until all the memory diagnostic programs 32a, 32b, and 32c are completely executed.

If the memory diagnosis unit 311 has determined that all the memory diagnostic programs have been executed (S22; Yes), the memory diagnosis unit 311 proceeds to step S23.

The OS error detection unit 315 detects if there is an OS error at startup or an OS startup error in step S23. If an OS startup error is detected (S23; Yes) as a result, the OS error detection unit 315 sends out a detection signal to the diagnostic result notification unit 316. Upon receiving the detection signal from the OS error detection unit 315, the diagnostic result notification unit 316 outputs a memory-quality evaluation table, which is updated by the memory-quality evaluation-table preparation unit 312 in step S21, to the display controller 40 as a result of the memory diagnosis of the DRAM 20. Subsequently, the memory-quality evaluation table is shown on the display 50 (step S24), which ends the memory diagnosis process. In contrast, if an OS startup error is not detected (step S23; No), the OS error detection unit 315 finishes the memory diagnosis process.

As described above, in this embodiment, the memory diagnosis unit 311 executes the memory diagnostic program 32a, the first memory diagnostic program, to diagnose the DRAM 20. The faulty area determination unit 313 determines the faulty areas in the DRAM 20, based on the diagnosis result by the memory diagnosis unit 311. The memory diagnostic unit 311 and the faulty area determination unit 313 function as the first memory diagnosis unit. In addition, the diagnostic program loading unit 314 loads the memory diagnostic program 32b, which will be executed next by the memory diagnosis unit 311, into part of the areas of the DRAM 20 excluding the faulty areas. The memory diagnosis unit 311 newly diagnoses, by executing the memory diagnostic program 32b loaded by the diagnostic program loading unit 314, the areas of the DRAM 20 other than the faulty areas determined by the faulty area determination unit 313. The diagnostic program loading unit 314 and the memory diagnostic unit 311 function as the second memory diagnostic unit. Therefore, the embodiment can avoid loading a memory diagnostic program into the faulty areas, where memory function does not properly work, of the main memory, which prevents the situation occurring where a memory diagnostic program cannot be executed properly.

Furthermore, the memory diagnosis unit 311, which functions as the first memory diagnosis unit, runs the memory diagnostic program 32a without loading the memory program 32a into the DRAM 20. Thus, where it is not certain that the main memory contains a faulty area, the memory diagnostic program does not have to be loaded into the main memory. This can avoid the situation where a memory diagnostic program cannot be executed properly As a result, it simplifies the determination of the healthy areas and the faulty areas, which leads to a highly efficient memory diagnostic process. Since the memory-quality evaluation-table preparation unit 312 prepares a memory-quality evaluation table that has associated the result of the memory diagnosis by the memory diagnosis unit 311 with the address information on the DRAM 20, an easy distinction between a faulty area and an area other than a faulty area can be made. This enables a higher efficiency of the memory diagnosis process.

The faulty area determination unit 313, which functions as the second memory diagnosis unit, extracts the address information on the areas of the DRAM 20 diagnosed as being in error by the memory diagnosis unit 311. An area corresponding to the extracted address information is excluded as faulty from the areas of the DRAM 20 for loading the second memory diagnostic program 32b. As a result, an easy distinction between a faulty area and an area other than the faulty area leads to an easy determination of the faulty area, which enables a higher efficiency of the memory diagnosis process.

The OS error detection unit 315 detects an OS startup error. The diagnostic result notification unit 315 notifies the result of the diagnosis by the memory diagnosis unit 311 when the OS error detection unit 315 detects an OS startup error. As a result, since a user can confirm the results of the diagnosis by the memory diagnosis unit 311, the user can immediately find the faulty areas in the DRAM 20 and take appropriate measures, such as exchanging the faulty areas.

Each of the functional units 311 to 316, which starts up when power is turned on, is incorporated into the BIOS program 31 that controls data to be input to and output from the DRAM 20. Moreover, the functional units are executed when the BIOS program 31 starts up. Therefore, before the OS starts up, the memory diagnostic process for the DRAM 20 can be executed. Even if the OS does not start up, a memory diagnostic program can be properly executed.

The embodiments in accordance with the invention are described so far. The invention can cover various, distinct embodiments other than those described above, within the range of the ideas disclosed in the claims.

For example, in the embodiment the first memory diagnostic program can be executed without being loaded into the main memory by the first memory diagnosis unit. This is not the only single embodiment. The invention also covers the following embodiment. A first memory diagnostic program, which occupies a smaller area, when loaded into a main memory, is loaded into the main memory by a first memory diagnostic unit. By doing so, a simple diagnosis of the main memory may be executed first. In this case, using the result of the diagnosis by the first memory diagnosis unit, a second and a third memory diagnostic program, which occupy larger areas when loaded into the main memory, are loaded into the main memory successively by a second and a third memory diagnostic unit, respectively. This enables the diagnosis of advanced memory functions.

In the embodiment, the memory diagnosis process that diagnoses the DRAM, a main memory, is described. This is not the only single embodiment. The invention covers the following embodiment. The memory diagnosis process for diagnosing a cash memory that is provided inside a CPU and is capable of high speed writing and reading can be applied.

The BIOS program 31 and the memory diagnostic program 32 of the embodiment do not necessarily have to be stored in the ROM 30. For example, these programs may be stored in a re-writable, non-volatile memory such as a flash memory and can be read out and executed by the CPU 10. Also, the BIOS program 31 and the memory diagnosis program 32 may be downloaded to a flash memory from a network-connected server. Moreover, the programs may be stored in a storage medium such as a CD-ROM and be read into a flash memory from the storage medium through a drive thereof.

According to the embodiment of the invention, the first memory diagnostic program, which does not use the main memory or occupies only a small portion of the main memory, is executed in order to perform a simple diagnosis of the main memory. Making use of the results of the diagnosis, the second diagnostic program, which needs to be loaded into the main memory and is capable of performing a detailed diagnosis, can be identified with respect to an arrangement location thereof. Consequently, the embodiment can reduce the possibility that the second memory diagnostic program is loaded into faulty areas in the main memory and can avoid a situation where the second memory diagnostic program cannot be executed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the spirit and scope of the invention.

What is claimed is:

1. A computer apparatus including a main memory, comprising:
   a first memory diagnosis unit for determining a faulty area in the main memory by executing a first memory diagnostic program; and
   a second memory diagnosis unit for loading sequentially a plurality of memory diagnostic programs from the one with smaller program size into areas of the main memory other than the faulty area determined by the first memory diagnosis unit, each of the plurality of memory diagnostic programs being larger in program size than the first memory diagnostic program and being loaded into areas of the main memory other than the faulty area which is re-calculated and determined, by the second memory diagnosis unit, using the previously loaded memory diagnostic program among the plurality of memory diagnostic programs.

2. The computer apparatus according to claim 1, wherein the first memory diagnosis unit executes the first memory diagnosis program, the first memory diagnosis program not being loaded into the main memory.

3. The computer apparatus according to claim 1, further comprising a memory-quality evaluation-table preparation unit for preparing a memory-quality evaluation table in which a result of the diagnosis of the main memory by the first memory diagnosis unit is associated with address information of the main memory.

4. The computer apparatus according to claim 3, wherein the second memory diagnosis unit extracts address information on the main memory that is diagnosed as being in error by the first memory diagnosis unit, with reference to the memory-quality evaluation table, and excludes as the faulty area an area corresponding to the extracted address information from areas for loading the plurality of memory diagnostic programs.

5. The computer apparatus according to claim 3, further comprising:
   an operating system (OS) error detection unit for detecting an error at a startup of an OS; and
   a diagnostic result notification unit for notifying a result of diagnosis of the main memory by the second memory diagnosis unit when the OS error detection unit has detected the startup error.

6. The computer apparatus according to claim 5, wherein each of the first memory diagnosis unit, the second memory diagnosis unit, the memory-quality evaluation-table preparation unit, the OS error detection unit, and the diagnostic result notification unit, which is incorporated in a basic input and output program that is a control program for controlling data to be input to and output from the main memory, starts up when power is turned on, and is executed when the basic input and output program has started up.

7. A method of diagnosing a main memory in a computer apparatus, comprising:
   determining a faulty area in the main memory by executing a first memory diagnostic program; and
   loading sequentially a plurality of memory diagnostic programs from the one with smaller program size into areas of the main memory other than the faulty area determined by the determining of the faulty area, each of the plurality of memory diagnostic programs being larger in program size than the first memory diagnostic program and being loaded into areas of the main memory other than the faulty area which is re-calculated and determined, at the loading, using the previously loaded memory diagnostic program among the plurality of memory diagnostic programs.

8. The method according to claim 7, wherein the determining of the faulty area executes the first memory diagnosis program without being loaded into the main memory.

9. The method according to claim 7, further comprising preparing a memory-quality evaluation table in which a result of the diagnosis of the main memory by the determining of the faulty area is associated with address information of the main memory.

10. The method according to claim 9, wherein the loading of the plurality of memory diagnostic programs extracts address information on the main memory that is diagnosed as being in error by the determining of the faulty area, with reference to the memory-quality evaluation table, and excludes as the faulty area an area corresponding to the extracted address information from areas for loading of the plurality of memory diagnostic programs.

11. The method according to claim 10, further comprising:
  detecting an error at a startup of an operating system (OS); and
  notifying a result of diagnosis of the main memory by the loading of the plurality of memory diagnostic programs when the detecting of the error has detected the startup error.

12. The method according to claim 11, wherein each of the determining of the faulty area, the loading of the plurality of memory diagnostic programs, the preparing of the memory-quality evaluation table, the detecting of the startup error, and the notifying of the result of diagnosis, which is incorporated in a basic input and output program that is a control program for controlling data to be input to and output from the main memory, starts up when power is turned on, and is executed when the basic input and output program has started up.

13. A non-transitory computer-readable storage medium that stores therein a computer program for diagnosing a main memory in a computer apparatus, the computer program causing the computer apparatus to execute:
  determining a faulty area in the main memory by executing a first memory diagnostic program; and
  loading sequentially a plurality of memory diagnostic programs from the one with smaller program size into areas of the main memory other than the faulty area determined by the determining of the faulty area, each of the plurality of memory diagnostic programs being larger in program size than the first memory diagnostic program and being loaded into areas of the main memory other than the faulty area which is re-calculated and determined, at the loading, using the previously loaded memory diagnostic program among the plurality of memory diagnostic programs.

14. The non-transitory computer-readable storage medium according to claim 13, wherein the first memory diagnosis program in the determining of the faulty area is executed without being loaded into the main memory.

15. The non-transitory computer-readable storage medium according to claim 13, further comprising preparing a memory-quality evaluation table in which a result of the diagnosis of the main memory by the determining of the faulty area is associated with address information of the main memory.

16. The non-transitory computer-readable storage medium according to claim 15, wherein in the loading of the plurality of memory diagnostic programs, address information on the main memory that is diagnosed as being in error by the determining of the faulty area is extracted, with reference to the memory-quality evaluation table, and an area corresponding to the extracted address information is excluded as the faulty area from areas for loading of the plurality of memory diagnostic programs.

17. The non-transitory computer-readable storage medium according to claim 16, further comprising:
  detecting an error at a startup of an operating system (OS); and
  notifying a result of diagnosis of the main memory by the loading of the plurality of memory diagnostic programs when the startup error has been detected.

18. The non-transitory computer-readable storage medium according to claim 17, wherein each of the determining of the faulty area, the loading of the plurality of memory diagnostic programs, the preparing of the memory-quality evaluation table, the detecting of the startup error, and the notifying of the result of diagnosis, which is incorporated in a basic input and output program that is a control program for controlling data to be input to and output from the main memory, starts up when power is turned on, and is executed when the basic input and output program has started up.

* * * * *